United States Patent [19]
Roemer et al.

[11] Patent Number: 4,885,539
[45] Date of Patent: Dec. 5, 1989

[54] VOLUME NMR COIL FOR OPTIMUM SIGNAL-TO-NOISE RATIO

[75] Inventors: Peter B. Roemer, Schenectady; Paul A. Bottomley, Clifton Park; William A. Edelstein, Schenectady, all of N.Y.

[73] Assignee: General Electric Company, Schenectady, N.Y.

[21] Appl. No.: 202,624

[22] Filed: Jun. 6, 1988

[51] Int. Cl.$^4$ ............................................. G01R 33/20
[52] U.S. Cl. ...................................... 324/318; 324/322
[58] Field of Search ..................... 324/309, 318, 322; 333/219; 128/653

[56] References Cited

U.S. PATENT DOCUMENTS 4,638,253  1/1987  Jaskolski ............................. 324/318
4,680,548  7/1987  Edelstein et al. ................... 324/318
4,692,705  9/1987  Hayes .................................. 324/318

FOREIGN PATENT DOCUMENTS 0141383  5/1985  European Pat. Off. ............ 324/318
2840178  3/1980  Fed. Rep. of Germany ...... 128/653

Primary Examiner—Michael J. Tokar
Assistant Examiner—Lawrence G. Fess
Attorney, Agent, or Firm—Geoffrey H. Krauss; James C. Davis, Jr.; Marvin Snyder

[57] ABSTRACT

A RF volume coil with optimized signal-to-noise ratio, for NMR use, has a reduced length $L_c$, which is between about $0.3r_s$ and about $1.5r_s$, where $r_s$ is the radius of a sample-to-be-investigated, contained within the cylindrical volume coil, with the volume coil radius $r_c$ being between about $1.0r_s$ and about $1.6r_s$. the "short" volume coil has an improved SNR for a voxel located substantially on the central plane of the coil, relative to the SNR of a "normal"-lenth volume coil with $L_c \geq 4r_s$.

20 Claims, 3 Drawing Sheets

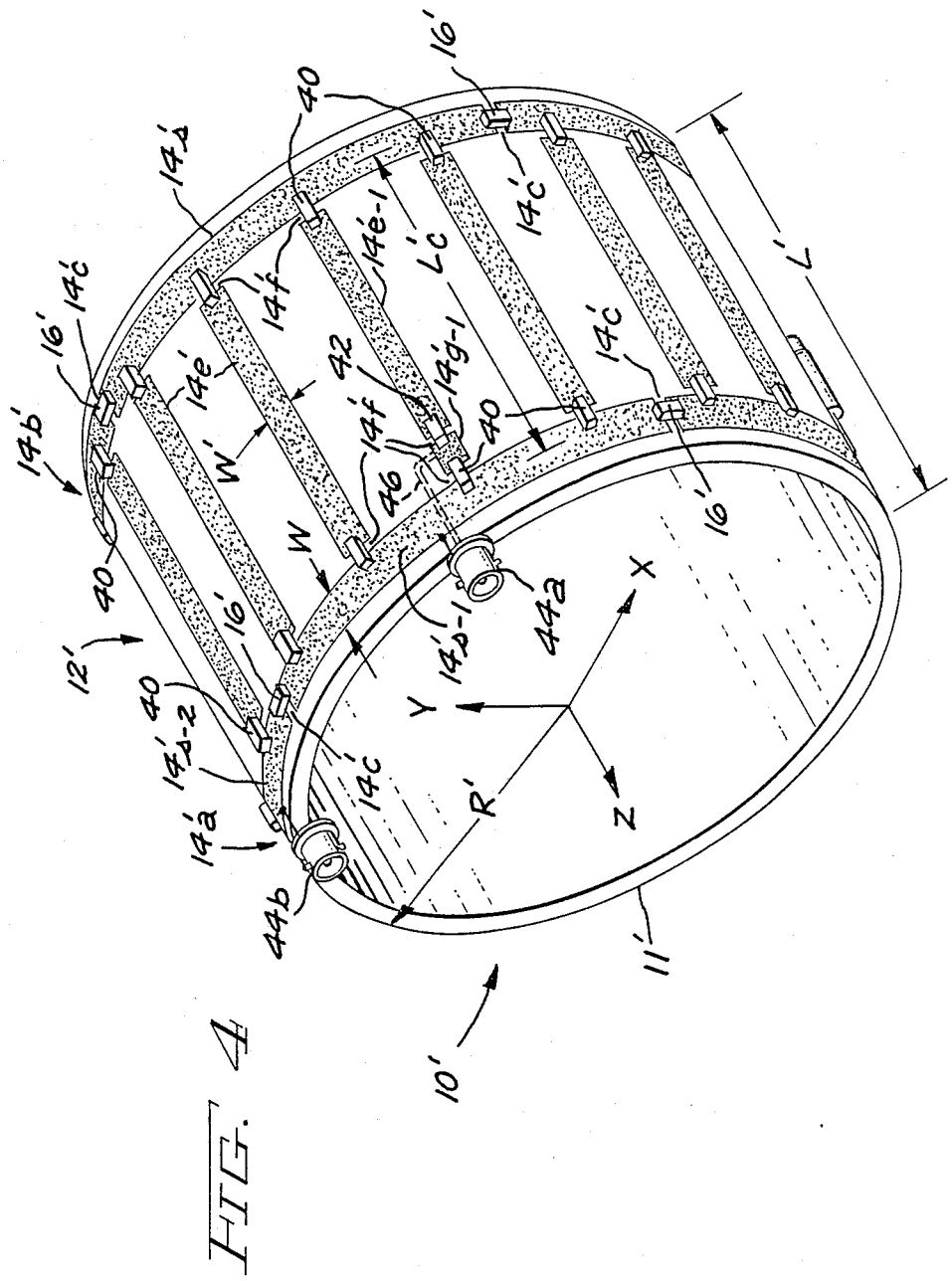

VOLUME NMR COIL FOR OPTIMUM SIGNAL-TO-NOISE RATIO

BACKGROUND OF THE INVENTION

The present invention relates to nuclear magnetic resonance (NMR) apparatus and, more particularly, to a novel radio-frequency (RF) coil of the "birdcage" form, having optimized signal-to-noise ratio (SNR) particularly when receiving RF signals in a NMR imaging or spectroscopy environment.

It is now well known to image and obtain chemical shift spectra from certain nuclei, such as $^1$H, $^{31}$P and the like, to determine the internal distribution and chemical form of those nuclei in a specimen, using NMR. In particular, NMR imaging of a particular nuclear species in the human body has proven to be medically and scientifically significant. It is now also well known that substantial increases in SNR can be observed by increasing the static magnetic field $B_O$ in which the specimen-to-imaged is immersed. It has been found that attempts to reduce the size of a volume picture element (voxel) by trading off this SNR advantage, result in relatively little reduction of the linear voxel extent, since the voxel linear dimension is apparently proportional to the cube root of the signal-to-noise ratio. However, a SNR increase can be utilized to shorten the data acquisition time, with acquisition time reductions proportional to the square of the SNR increase being realizable. Accordingly, it is highly desirable to increase, to the greatest extent possible, the signal-to-noise ratio in a NMR RF volume coil, and particularly in the form of RF volume coil known as a "birdcage" coil, which is one having a pair of conductive loop elements spaced along a common longitudinal axis, with each of the loop elements having a plurality of series-connected capacitance elements spaced along the loop peripheries, and with a like plurality of axial conductive elements electrically interconnecting the conductive loop elements at points between adjacent ones of the serially-connected capacitive elements. such as are described and claimed in U.S. Pat. Nos. 4,680,548 and 4,692,705, respectively issued July 14, 1987 and Sept. 8, 1987, both assigned to the assignee of the present application and both incorporated herein in their entireties by reference.

BRIEF SUMMARY OF THE INVENTION

In accordance with the invention, a RF volume coil with optimized signal-to-noise ratio, for NMR and the like use, has a reduced length $L_c$, which is between about $0.3r_s$ and about $1.5r_s$, where $r_s$ is the effective radius of a sample-to-be-investigated, contained within the cylindrical volume coil, with the volume coil radius $r_c$ being between about $1.0r_s$ and about $1.6r_s$. Such a "short" volume coil has an improved SNR for a voxel located substantially along the axis of the coil, although the sensitivity S of the coil is nonuniform, especially for voxels removed from the coil axis, relative to the SNR of a "normal"-length volume coil with $L_c \geq 4r_s$.

In one presently preferred embodiment, an optimized SNR volume coil, of "birdcage" form, designed for detection of NMR response signals from $^{31}$P nuclei at about 26 MHz., has a length $L_c$ of about $1.0r_s$ and a coil radius $r_c$ of about $1.1r_s$, and has better than a 60 percent increase in SNR relative to a cylindrical volume coil, of the same form, having a length of about four times the sample radius. Operation of the detection coil in a true-quadrature mode, to detect only the circularly-polarized NMR field, contributes an additional SNR improvement of about 40 percent.

Accordingly, it is an object of the present invention to provide a novel volume RF coil, for use in NMR and the like systems, having an improved signal-to-noise ratio.

This and other objects of the present invention will become apparent upon reading of the following detailed description, when considered in conjunction with the drawings.

BRIEF DESCRIPTION OF THE DRAWINGS

FIG. 4 is a perspective view of one presently preferred low-pass birdcage embodiment of the optimized volume RF coil of the present invention.

DETAILED DESCRIPTION OF THE INVENTION

Figure 1:
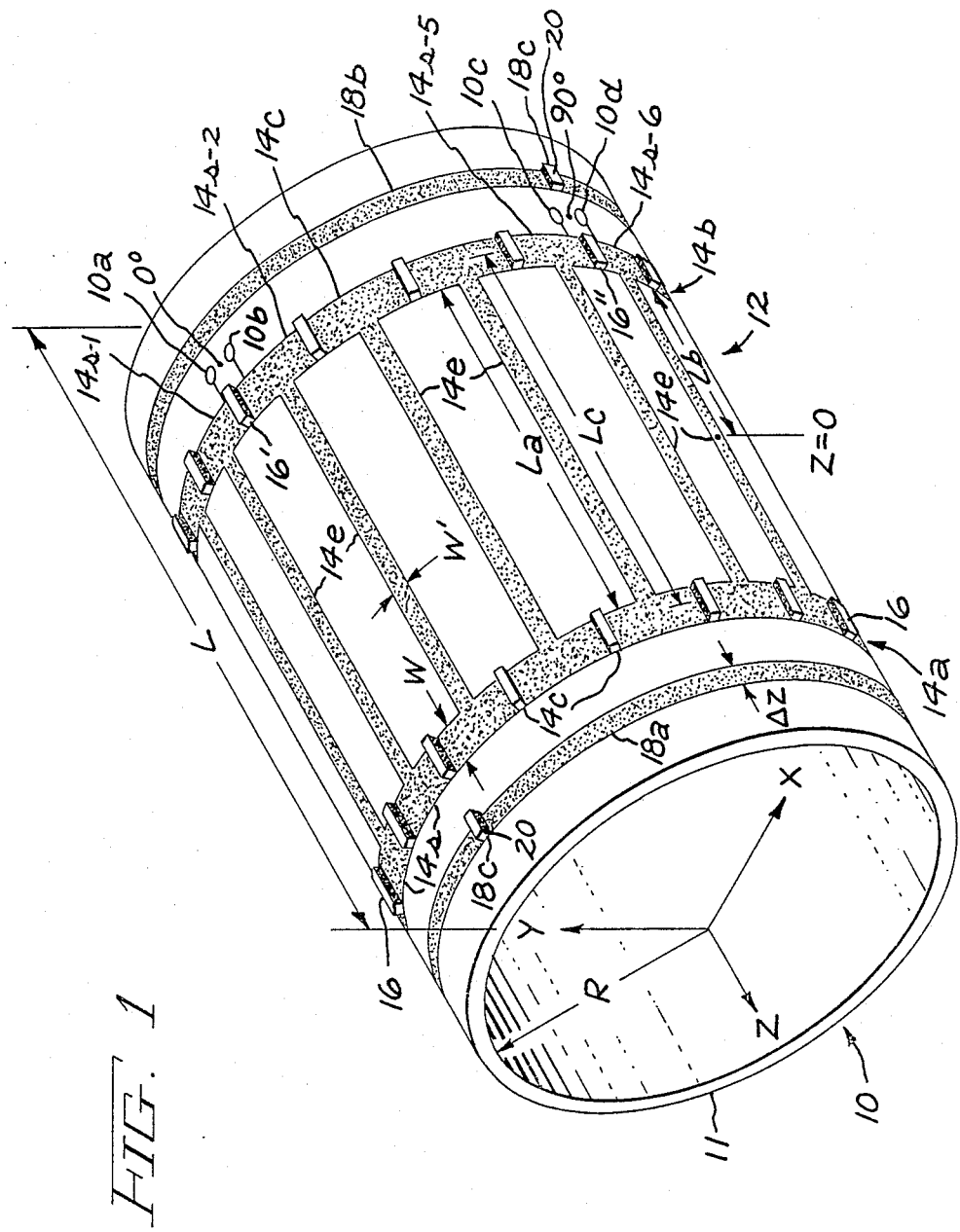
FIG. 1 is a perspective view of one presently preferred high-pass birdcage embodiment of the optimized volume RF coil of the present invention.

Referring initially to FIG. 1, a volume RF coil assembly 10, is of cylindrical form, and is supported by a non-magnetic, non-conducting and non-dielectric tube 11, of acrylic and the like material, having a radius R and a length L, which for a coil for imaging of a human head are illustratively of about 5 inches and about 8 inches, respectively. The axis of the cylindrical coil form 11 is aligned with the Z axis of a Cartesian coordinate system, and with the center Z=0 of that system lying at the axial center of the coil 10. An antenna portion 12 of assembly 10 is comprised of first and second spaced-apart conductive loop elements 14a and 14b, each having a width W, here, about one-half inch, with the facing edges of conductors 14a and 14b having a spacing $L_a$, here, about 4.5 inches, such that the edge planes of conductors 14a and 14b are each at a distance $L_b$, here, about 2.25 inches, from the axial center Z=0 plane; the effective length $L_c$ of the coil is about 5 inches. Each of conductors 14a and 14b is broken at each of a plurality N of locations, typically in axial alignment, by a small gap 14c so as to form a like plurality N of substantially identical conductive segments 14s. Advantageously, the number N of segments is represented by a power p of base 2, i.e. $N=2^p$, where p=1, 2, 3, ... In the illustrated embodiment, p=4 and N=16. Each of the 16 conductor gaps 14c is bridged with a serially-connected capacitive element 16. Each of a like plurality N of axial conductive elements 14e interconnect similarly disposed segments 14s of the first and second spaced-apart loop elements 14a and 14b; each axial conductive element 14e has a width W', here, about one-half inch. First and second conductive end rings 18a and 18b, if used, are formed in planes substantially parallel to the planes of lop elements 14, but axially extended therebeyond; each end ring is of thickness ΔZ (here, about one-half inch) and has at least one gap 18c therein, with each gap being bridged by an associated serially-connected capacitive element 20; the end rings tend to eliminate undesirable coil resonances.

This particular high-pass "birdcage" form of optimized-SNR volume RF coil 10 has a balanced feedpoint between first and second terminals 10a and 10b, which are connected across one of the capacitors 16, illustratively connected to adjacent conductive segments 14s-1 and 14s-2, respectively, and across capacitor 16'. Advantageously, the coil will be connected for quadrature excitation and/or reception, with a second balanced feedpoint being provided between third and fourth terminals 10c and 10d, which are connected to adjacent conductive segments 14s-5 and 14s-6, respectively, and across another capacitor 16'', which is situated in that part of coil loop 14b having a radial reference substantially at 90° to a radial reference extended from the cylinder axis to the first balanced input about capacitor 16'. The use of baluns, balanced multiple-half-wavelength cables, hybrid quadrature elements and the like, to couple the quadrature feedpoints to a single unbalanced reception cable, and the like configurations external to coil 10, are all well known to the art.

The operation of volume detection coil 10 can be analyzed by the principle of reciprocity, so that the RF coil 10 NMR signal-to-noise ratio $\psi$ detected from a voxel located at a point $(r,\theta,z)$ in the cylindrical polar coordinate system, with origin $z=0$ at the coil center and with, as here, the Z axis coincident with the coil cylindrical axis, is $$\psi \alpha B_1(r,\theta,z)/\sqrt{R} \quad (1)$$

where $B_1$ is the transverse RF magnetic field produced by a unit current and R is the total noise resistance at the NMR angular frequency $\omega$. In optimizing ratio $\psi$ along the coil axis, the transverse RF magnetic field $B_l$ of a birdcage coil geometry with length $L_c$ and radius $r_c$ is, for a maximum end-ring 18 unity current, produced by sinusoidal current distributions J, so that $$J = (-z\sin\theta/|z|W)\theta + ((|z|-L_c/2)\cos\theta/r_cW)z, \text{ for } (L_c/2)-W \leq |Z| \leq L_c/2, \quad (2)$$

in each loop element 14 of width W, and $$J = (-\cos\theta/r_c)z, \text{ for } |z| < (L_2/2)-W. \quad (3)$$

The magnetic scalar potential ($100_m$) inside the coil obtains from matching the separate solutions from Laplace's equation to a Fourier decomposition of the currents:

$$\phi_m(r,\theta,z) = \int_0^\infty A(k) k = r_c K'_1(k=r_c) I_1(k=r) \sin\theta \cos(k=z) dk \quad (4)$$

with $$A(k) = (2\cos k(L_c/2-W) - 2\cos(L_c/2))/\pi k^2 \Delta z \quad (5)$$

where $K'_1$ is a derivative of a modified Bessel function of the second kind with respect to the total argument. The RF magnetic field $B_1(r,\theta,z)$ is then obtained by numerical computation of the magnetic field transverse component, in a space of permeability $\mu_0$, so that $$\underline{B}(r,\theta,z) = -\mu_0 \underline{\nabla} \phi_m. \quad (6)$$

The total effective NMR noise resistance R comprises contributions from both the coil and the sample. We consider only the contributions to noise resistance R from sample losses, as coil losses can be rendered relatively small. Again invoking reciprocity, $$R = \sigma \int <E \cdot E> dV = \frac{\sigma}{2} \int E \cdot E dV \quad (7)$$

where $\sigma$ is the average conductivity of the sample (and is assumed to be uniform), E is the electric field induced in the sample by a time-dependent magnetic field B $\cos(\omega t)$ produced by a unit coil current $I_1$, and the volume integral extends over the entire sample. We deduce E from Faraday's law, $$\underline{\nabla} \times \underline{E} = -\partial \underline{B}/\partial t \quad (8)$$

and equation (6), as $$\nabla \times \underline{E} = -\nabla \phi_e + (\mu_0 \omega \int_0^\infty (A(k)/k=)I_1(k=)\cos\theta\sin(k=z)dk)\hat{z} -(\mu_0 \omega \int_0^\infty A(k)I'_1(k=)\sin\theta\sin(k=z)dk)\hat{r} \quad (9)$$

with the time dependent $\sin(\omega t)$ factors suppressed, and $$\nabla \phi_e = \mu_0 \omega \int_0^\infty (A(k)I_1(k=_s)/k^2 = I'_1(k=_s))I_1 \times (k=)\cos\theta\sin(k=z)dk. \quad (10)$$

assuming the boundary condition of no current flow normal to the sample surface at sample radius $r_s$, and also that the magnet fields associated with the induced currents do not themselves significantly alter the RF magnetic field $B_1$. The sample noise resistance R is obtained by substitution of equations (5), (9), and (10) in equation (7), and numerical integration.

Figure 2:
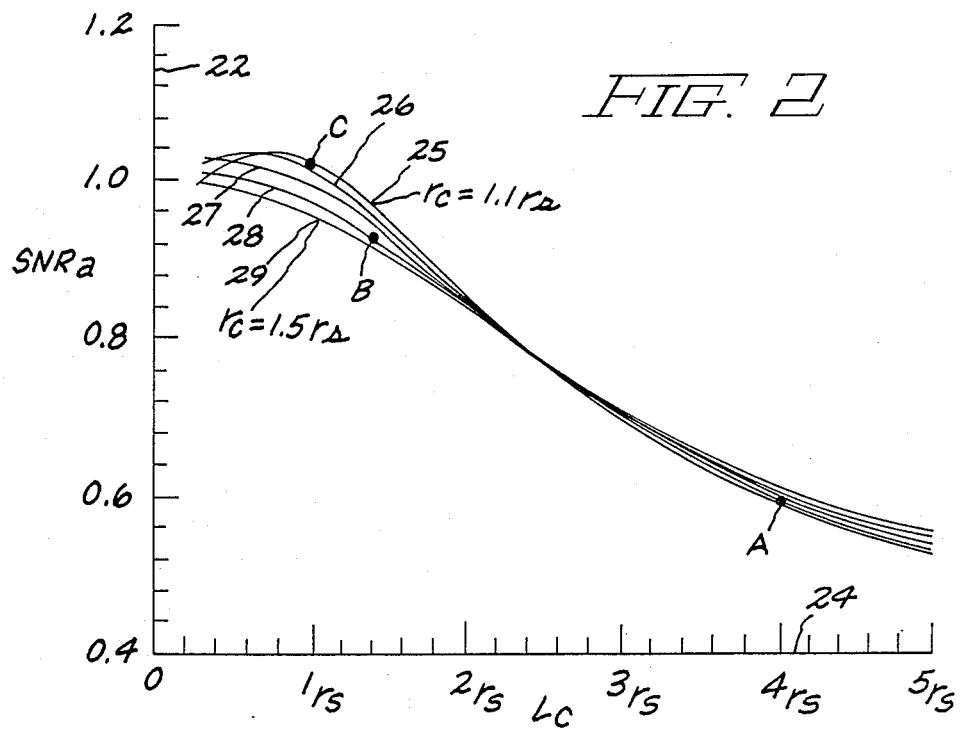
FIG. 2 is a graph illustrating the relative signal-to-noise ratio of volume RF coils having fixed ratios of sample radius and coil radius, for varying coil lengths, and useful in appreciating the improvement of the present invention.

Referring now to FIG. 2, the achieved NMR signal-to-noise ratio $SNRa = B_1/\sqrt{R}$, at the center of the coil (for $X=0$, $Y=0$ and $Z=0$) is plotted along ordinate 22 as a function of coil length $L_c$, which is plotted along abscissa 24 for several values of coil radius $r_c$, where both the coil length and coil radius are in terms of the effective radius $r_s$ of the sample within the coil. The SNR values are seen to depend upon the ratio of the coil radius $r_c$ and sample radius $r_s$; within the desirable range from about $r_c/r_s=1.0$ to about 1.6, the five curves 25, 26, 27, 28 and 29 respectively represent ratios of 1.1, 1.2, 1.3, 1.4 and 1.5. The effective sample radius $r_s$ will not only depend upon the size of the sample, but also the sample shape; portions of human anatomy, such as the head, may appear, within the coil, as a RF load having an effective radius $r_s$ different from any major dimension of that anatomical portion. It will be seen that coil radius $r_c$ is a relatively insignificant factor affecting SNR $\psi$ when sample noise is dominant. It will also be seen that the normal coil length $L_c$ of about $4r_s$, as shown at point A, has a relative SNRa of about 0.6, which can be improved by approximately 50 percent, to a value of SNRa of about 0.9, at point B, by shortening the coil to a length of about $L_c=1.4r_s$. It will also be seen that a further shortening of the coil length to about $L_c=1.0r_s$, at point C (with a coil radius $r_c$ of about 1.1), has a relative SNRa in excess of 1.0, and provides at least 65 percent higher SNR, relative to the SNRa value at point A, for the normal long coil. The use of quadrature operation can add an additional 40%, so that SNR improvement of 100%, or better, is possible, relative to a single-fed, long birdcage RF coil.

Figure 3:
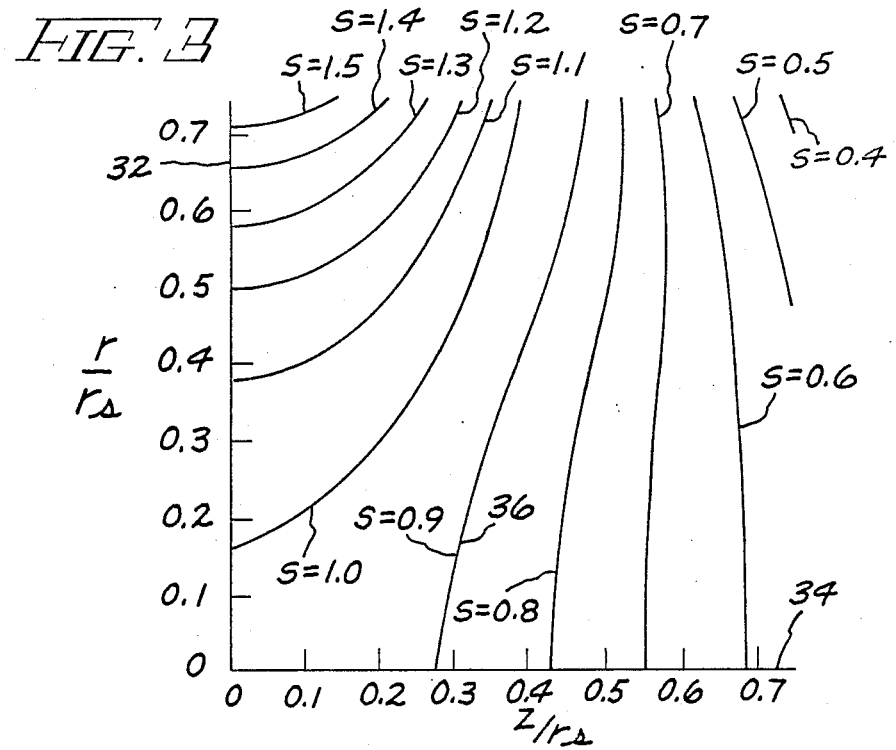
FIG. 3 is a graph illustrating the relative sensitivity of the coil for voxels at various radial distances from the coil axis, for various axial positions within the coil, and also useful in appreciating the features of the present invention.

Referring now to FIG. 3, a relative signal-to-noise ratio sensitivity S is plotted along ordinate 32 for various values of normalized radial distance ($r/r_s$) from the Z axis of the cylindrical coil 10, and for values, along abscissa 34, of various normalized axial distances ($z/r_s$) from the coil center, $z=0$, in either direction towards the coil ends, for a particular coil having a coil radius $r_c = 1.4 r_s$. It will be seen that the aforementioned 50 percent SNR increase, to a SNRa value of 0.9 at point B (relative to a $SNR_a$ of 0.6 at point A), is obtained at all locations along the $S=0.9$ curve 36, and that even greater relative SNR values S can be obtained closer to the center of the coil and/or at radially increased distances from the coil axis. Thus, it is seen that the penalty paid in RF magnetic field $B_1$ inhomogeneity is relatively modest, amounting to about 33 percent in the ($r, \theta, z = 0$) plane and in transaxial planes out to about $z = 0.75 r_s$. Since the NMR flip angle $\alpha$ produced by a RF excitation field $B_1$ is proportional to the magnitude of the $B_1$ field, and the magnetization is proportional to $\sin\alpha$, such inhomogeneity would result in only about a 13 percent loss in signal, at worst, at the center of the sample, if flip angle $\alpha$ were set at 90° at the sample surface, notwithstanding spin lattice relaxation effects. Therefore, this short volume coil design, with length $L_c$ being less than $2r_s$, for $r_c/r_s$ between about 1.0 and about 1.6, is well suited for both NMR sample excitation and response signal reception. It will also be seen that additional reduction of the coil length, to $L_c$ less than $1.0 r_s$, may provide marginally additional enhancement in SNR $\psi$, particularly if the coil radius $r_c$ is also maintained at values between about $1.0 r_s$ and about $1.6 r_s$. We have, however, found that additional gain in SNR cannot be realized in practice, as $L_c$ approaches zero, because the originally-assumed condition (that the sample noise dominates) cannot be obtained; as $L_c$ approaches zero, the RF magnetic field $B_1$ decreases faster than the coil noise contributions. Also, because the coil radius $r_c$ must be chosen to accommodate a range of human subjects and their non-cylindrical anatomies, it may be difficult to maintain the coil radius $r_c$ in the range of $1.0 r_s$ to $1.6 r_s$.

Referring now to FIG. 4, a presently preferred embodiment of a low-pass RF volume NMR coil assembly 10' is supported by a non-magnetic, non-conducting and non-dielectric tube 11', having a radius R' and a length L' which, for a coil devoid of end rings (which are not needed, as no interfering resonances are encountered at nearby frequencies), is slightly longer than the effective coil length $L'c$. The axis of cylindrical coil form 11' is aligned with the Z axis and the center $Z = 0$ of that system is at the axial center of the coil. An antenna portion 12' is comprised of first and second spaced-apart conductive loop elements 14'a and 14'b, each having the same width W as in coil 10 of FIG. 1. The effective length $L'_c$ of the coil and the radius R' are both about 5 inches. Each of conductors 14'a and 14'b is broken at each of a plurality M of locations, typically in axial alignment, by a small gap 14'c so as to form a like plurality M of substantially identical conductive segments 14's. Advantageously, the number M of segments is represented by a power q of base 2, i.e. $M = 2^q$, where $q = 1, 2, 3, \ldots$ In the illustrated embodiment, $q = 2$ and $M = 4$. Each of the conductor gaps 14'c is bridged with a serially-connected capacitive element 16'. Each of another plurality N (here, equal 16) of axial conductive elements 14'e are disposed perpendicular to similarly disposed segments 14's of the first and second spaced-apart loop elements 14'a and 14'b; each axial conductive element 14'e has a width W', here, about one-half inch. The ends of each element 14'e are separated from the adjacent segments 14's by one of gaps 14'f; each gap 14'f is bridged by a capacitive element 40.

This particular low-pass "birdcage" form of optimized-SNR volume RF coil 10' has a feedpoint 44a at an element 14'g-1, which is separated from element 14'e-1 by a gap 14'f bridged by a capacitor 42. The unbalanced feedpoint connector 44a has the shield thereof connected to segment 14's-1 and its center conductor connected via conductor 46 to element portion 14'g-1. For quadrature excitation, a second unbalanced feedpoint 44b is located 90° from the first feedpoint 44a.

In use, a presently preferred embodiment 10', as illustrated with 5 inch coil radius $R' = r'_c$ and 5 inch length $L'_c$ for a sample radius $r_s$ of about 3.5 inches, was utilized for NMR sample excitation and response signal detection. The coil was operated in the true-quadrature mode by connection of a 0° input to connector 44a and a 90° input to connector 44b, i.e. with $\theta = 90°$ spacing, to provide an additional $\sqrt{2}$ improvement in SNR $\psi$ and a two-fold reduction in the necessary excitation pulse power. The spectral SNR $\psi$ of a 20 ml. sample of 1M $H_3PO_4$, located at the coil center ($z = 0$ and $r = 0$), was 28, as recorded from a single freeinduction-decay (FID) in a bandwidth of 2 KHz., with a 12 Hz. line-broadening exponential filter and with the coil load adjusted, by connection of a resistor of the appropriate value across the coil inputs, to be equivalent to that load provided by a human head. The broadened full-width-half-maximum $H_3PO_4$ line width was 54 Hz. The corresponding value of SNR $\psi$, obtained with a $^{31}P$ surface coil with a radius of 6.5 centimeters and distributed capacitance design, for a loaded head equivalent, was 18, with the phosphate sample located both on the surface coil axis and at a depth of 6.5 cm. from the coil (depth equal to coil diameter); a SNR $\psi$ value of 56 was obtained at a depth of 3.8 centimeters. Loaded and unloaded coil quality factors (Q) were respectively 410 and 100 for the short birdcage coil, and were respectively 430 and 130 for the surface coil, at resonance; resonant frequency changes of the loaded coils were negligible. These values indicate that the relative contributions of sample noise to total detected noise were similar, being about 76% for the short birdcage coil and about 70% for the surface coil.

While several presently preferred embodiments of our novel short volume coil with optimized SNR, have been described herein, many variations and modifications will now become apparent to those skilled in the art. For example, while the analysis, supra, applies specifically to the high-pass and low-pass birdcage coils of FIGS. 1 and 4, respectively, because of the assumption of relatively good azimuthal field homogeneity (i.e. uniformity of field with respect to polar angle $\theta$), the basis of this analysis is equally as well applicable to other transverse coils, such as solenoidal, saddle and sinusoidal designs, with and without distributed capacitance (i.e., most coils producing an RF field in a direction substantially perpendicular to the main static magnetic field in which the RF coil is immersed), as known to the art; these designs can all provide SNR benefit when $L_c$ and $r_c$ are chosen according to the invention, i.e. $0.3 r_s \leq L_c \leq 1.5 r_s$ and $1.0 r_s \leq r_c \leq 1.6 r_s$. It is our intent, therefore, to be limited only the scope of the appending claims, and not by the details and instrumentalities presented by way of description of the preferred embodiment herein.

What we claim is:

1. A radio-frequency (RF) volume coil, for at least one of excitation and reception of NMR response signals from a sample having an effective radius $r_s$, comprising:
   a tube of an insulative material and having exterior surface; and
   a conductive, generally cylindrical RF antenna fabricated upon said exterior surface with a radius $r_c$ which is between about $1.0 r_s$ and about $1.6 r_s$ and an effective length $L_c$ of less than $2 r_s$, and having a signal-to-noise ratio (SNR), when said sample is enclosed within said antenna, greater than the SNR of a similar RF antenna having the same radius $r_c$ and an effective length of at least $4 r_s$.

2. The RF volume coil of claim 1, wherein the effective length $L_c$ is between about $0.3 r_s$ and about $1.5 r_s$.

3. The RF volume coil of claim 2, wherein the RF antenna radius $r_c$ is between about $1.1 r_s$ and about $1.5 r_s$.

4. The RF volume coil of claim 2, wherein the effective length $L_c$ is between about $1.0 r_s$ and about $1.4 r_s$.

5. The RF volume coil of claim 4, wherein the RF antenna radius $r_c$ is between about $1.1 r_s$ and about $1.5 r_s$.

6. The RF volume coil of claim 1, wherein the RF antenna has first and second feedpoints positioned for quadrature response signal reception.

7. The RF volume coil of claim 1, wherein the RF antenna is of a birdcage form, including: first and second spaced-apart conductive loop elements, each located in a plane substantially perpendicular to the axis of the tube and broken by a plurality of substantially equally spaced gaps into a like plurality of conductive segments and with each of a second plurality of parallel conductive axial elements disposed and coupled between a like positioned segment in each of the first and second loop elements; a different one of a plurality of capacitive elements serially connected across a different associated one of the gaps in each of the first and second loop elements; and means for providing a first feedpoint at a selected location along one of the loop elements.

8. The RF volume coil of claim 7, wherein each of the loop element conductors has a width W substantially equal to the width W' of each axial element.

9. The RF volume coil of claim 8, wherein width W is about one order of magnitude less than the coil length $L_c$.

10. The RF volume coil of claim 7, wherein the RF antenna is of a high-pass birdcage form.

11. The RF volume coil of claim 7, wherein the RF antenna is of a low-pass birdcage form.

12. The RF volume coil of claim 7, further comprising means for providing another feedpoint at another selected location along the same loop element.

13. The RF volume coil of claim 12, wherein the another feedpoint has an electrical separation of about 90 degrees from the first feedpoint.

14. The RF volume coil of claim 13, wherein the coil radius $r_c$ is on the order of 5 inches.

15. The RF volume coil of claim 14, wherein the coil effective length $L_c$ is on the order of 5 inches.

16. The RF volume coil of claim 7, wherein the effective length $L_c$ is between about $0.3 r_s$ and about $1.5 r_s$.

17. The RF volume coil of claim 16, wherein the antenna radius $r_c$ is between about $1.1 r_s$ and about $1.5 r_s$.

18. The RF volume of claim 17, wherein the effective length $L_c$ is between about $1.0 r_s$ and about $1.4 r_s$.

19. The RF volume coil of claim 18, where the coil radius $r_c$ is on the order of 5 inches.

20. The RF volume coil of claim 19, wherein the coil effective length $L_c$ is on the order of 5 inches.

* * * * *